United States Patent
Suh et al.

(10) Patent No.: US 7,817,220 B2
(45) Date of Patent: Oct. 19, 2010

(54) LCD INCLUDING BACKLIGHT UNIT AND RECEIVING MEMBER HAVING A REINFORCING TAB EXTENDED FROM A BASE PLATE AND BENT TO BE IN CONTACT WITH AN OPENING IN A MOLD FRAME

(75) Inventors: Chung Woo Suh, Gwacheon-Si (KR); Young Bee Chu, Suwon-Si (KR); Ik Soo Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 335 days.

(21) Appl. No.: 11/932,324

(22) Filed: Oct. 31, 2007

(65) Prior Publication Data

US 2008/0174715 A1    Jul. 24, 2008

(30) Foreign Application Priority Data

Jan. 20, 2007    (KR) .................. 10-2007-0006373

(51) Int. Cl.
*G02F 1/1333*    (2006.01)

(52) U.S. Cl. .................. 349/58; 362/97.3; 362/633
(58) Field of Classification Search ............ 349/58–60; 362/97.3, 632–634
See application file for complete search history.

(56) References Cited

U.S. PATENT DOCUMENTS

| | | | |
|---|---|---|---|
| 2004/0090567 A1* | 5/2004 | Lee et al. | 349/58 |
| 2004/0189888 A1* | 9/2004 | Ypu et al. | 349/58 |
| 2006/0103774 A1* | 5/2006 | Han et al. | 349/58 |
| 2006/0119761 A1* | 6/2006 | Okuda | 349/58 |

* cited by examiner

*Primary Examiner*—John Heyman
(74) *Attorney, Agent, or Firm*—Innovation Counsel LLP

(57) ABSTRACT

A liquid crystal display having a receiving member, and a backlight unit wherein the receiving member includes a mold frame having a part mounting unit that has a predetermined receiving space, and a chassis fastened to the mold frame which includes a reinforcing tab in contact with and reinforcing the part mounting unit.

12 Claims, 8 Drawing Sheets

LCD INCLUDING BACKLIGHT UNIT AND RECEIVING MEMBER HAVING A REINFORCING TAB EXTENDED FROM A BASE PLATE AND BENT TO BE IN CONTACT WITH AN OPENING IN A MOLD FRAME

CROSS REFERENCE TO RELATED APPLICATION

This application claims priority from Korean Patent Application No. 10-2007-0006373 filed on Jan. 20, 2007 in the Korean Intellectual Property Office, the disclosure of which is incorporated herein by reference in its entirety.

BACKGROUND OF THE INVENTION

1. Field of the Invention

The present invention relates to a liquid crystal display including a backlight unit and receiving member having a reinforced mold frame.

2. Description of the Related Art

Liquid crystal displays have the advantages of small size, light weight, and larger screen compared to cathode ray tube displays and are used in laptop computers, monitors for desktop computers, large display devices, and mobile communication devices. The liquid crystal display device displays desired images by controlling the quantity of transmitted light according to image signals applied to a plurality of control switches arranged in a matrix form on the crystal display panel. A driving circuit unit and a backlight unit provide light to the liquid crystal display panel. Parts may be mounted on a module of the liquid crystal display in order to ensure slimness of the liquid crystal display. To mount the parts on the module, a portion of the mold frame on which the parts are to be mounted should be removed.

However, if a portion of the mold frame is removed to establish an area on which the parts can be mounted, the mold frame may be less resistant to impact and the mold frame, liquid crystal display panel or circuit components may be damaged.

SUMMARY OF THE INVENTION

According to an aspect of the present invention, a liquid crystal display includes a backlight unit and a receiving member that has a reinforced mold frame where a part mounting unit is provided.

According to an embodiment of the present invention, a receiving member includes, a mold frame having a part mounting unit providing a predetermined receiving space; and a chassis linked to the mold frame that includes a reinforcing tab formed to be in contact with the part mounting unit to improve the strength of the part mounting unit. The mold frame includes a plurality of sidewalls and the part mounting unit formed on any one wall of the plurality of the sidewalls. And the chassis includes a base plate and a plurality of walls extended and bent from the base plate.

The part mounting unit includes a mounting surface, a notch that is formed at one side of the mounting surface, and at least one opening that is formed inside the mounting surface.

To expose the openings of the mold frame, a portion of the sidewalls of the chassis and a portion of the base plate corresponding to the openings are removed.

The reinforcing tab is extended and bent from the base plate, and formed to be in contact with the opening.

The part mounting unit further includes a linking part formed in the opening, and the reinforcing tab is linked into the linking part.

The reinforcing tab has the corresponding size and position to the linking part.

The linking part is formed in a region not facing the notch.

According to another embodiment of the present invention, a backlight unit includes a light source unit; a mold frame that includes a part mounting unit on which the light source unit is mounted and that has a predetermined receiving space inside; and a receiving member including the mold frame and the chassis that is linked to the mold frame and includes a reinforcing tab in contact with the part mounting unit to improve the strength thereof.

The light source unit includes a light emitting diode, and a first circuit substrate where the light emitting diode is mounted onto.

The mold frame includes a plurality of sidewalls, the part mounting unit being formed on any one wall of the plurality of the sidewalls. The chassis includes a base plate and a plurality of sidewalls extended and bent from the base plate. And the part mounting unit includes a mounting surface, a notch formed at one side of the mounting surface, and at least one opening formed inside the mounting surface.

The light emitting diode is disposed in the notch of the part mounting unit.

To expose the opening of the mold frame, a portion of the sidewalls of the chassis and a portion of the base plate corresponding to the opening are removed.

The reinforcing tab is extended and bent from the base plate, and formed to be in contact with the opening.

The part mounting unit further includes a linking part formed inside the opening, and the reinforcing tab is linked with the linking part.

According to another embodiment of the present invention, a liquid crystal display including a backlight unit and a liquid crystal display panel disposed on the backlight unit to display images is provided. The aforementioned backlight unit includes a light source unit including a light emitting diode, and a first circuit substrate where the light emitting diode is mounted onto; a mold frame having a part mounting unit where the light source unit is mounted onto, and a predetermined receiving space inside; and a receiving member including a chassis linked to the mold frame. The aforementioned chassis includes a reinforcing tab formed to be in contact with the part mounting unit to improve the strength of the part mounting unit.

The liquid crystal display further includes a driving circuit unit including a second circuit substrate that is bonded to a side of the liquid crystal display panel, and circuit components that are mounted on the second circuit substrate in order to drive the liquid crystal display panel.

The mold frame includes a plurality of sidewalls, and a part mounting unit that is formed on any one wall of the plurality of the sidewalls. The chassis includes a base plate and a plurality of sidewalls extending and bending from the base plate. And the part mounting unit includes a mounting surface, a notch formed at one side of the mounting surface, and at least one opening formed inside the mounting surface.

The reinforcing tab is extended and bent from the base plate, and formed to be in contact with the opening.

A light emitting diode is disposed in the notch of the part mounting unit, and at least a portion of the circuit components of the driving circuit unit is disposed in the opening of the part mounting unit.

BRIEF DESCRIPTION OF THE DRAWINGS

The above and other features and advantages of the present invention will become more apparent by describing in detail preferred embodiments thereof with reference to the attached drawings in which.

DESCRIPTION OF THE PREFERRED EMBODIMENTS

Preferred embodiments of the present invention will be described in detail with reference to the accompanying drawings hereinafter.

Figure 1:
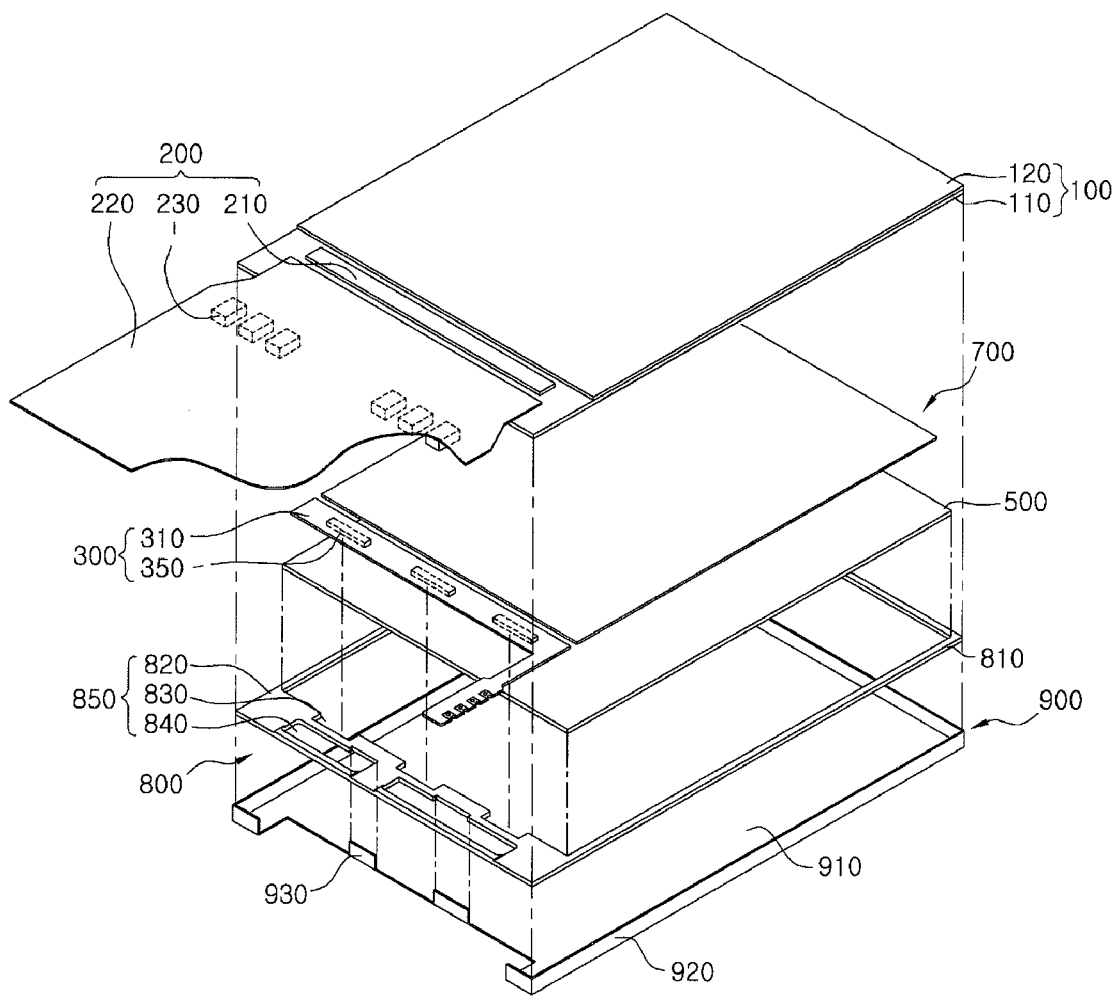
FIG. 1 is an exploded perspective view of a liquid crystal display including a receiving member according to a first embodiment of the present invention.
Figure 2A:
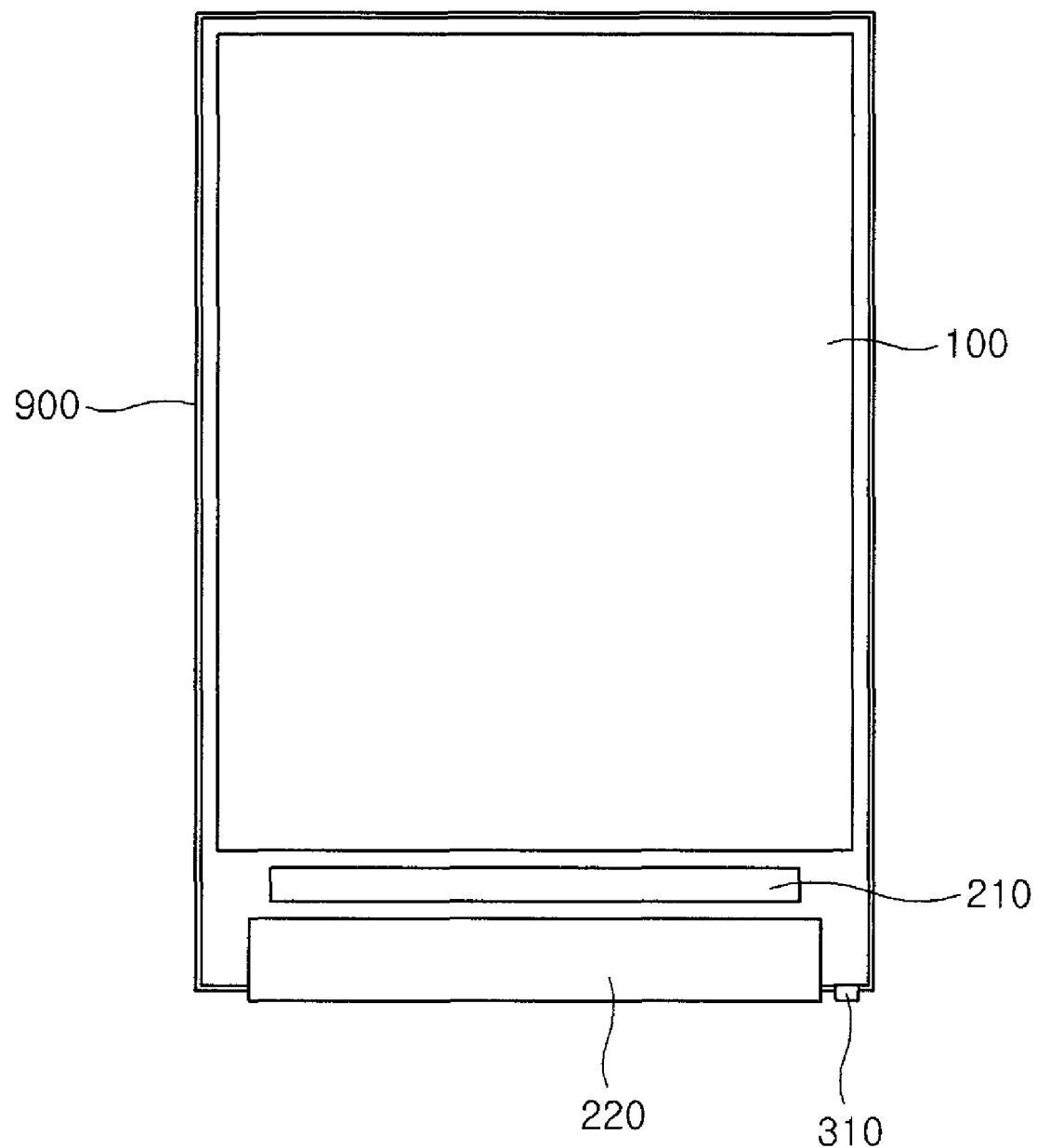
FIG. 2A is a plan view of the liquid crystal display illustrated in FIG. 1.
Figure 2B:
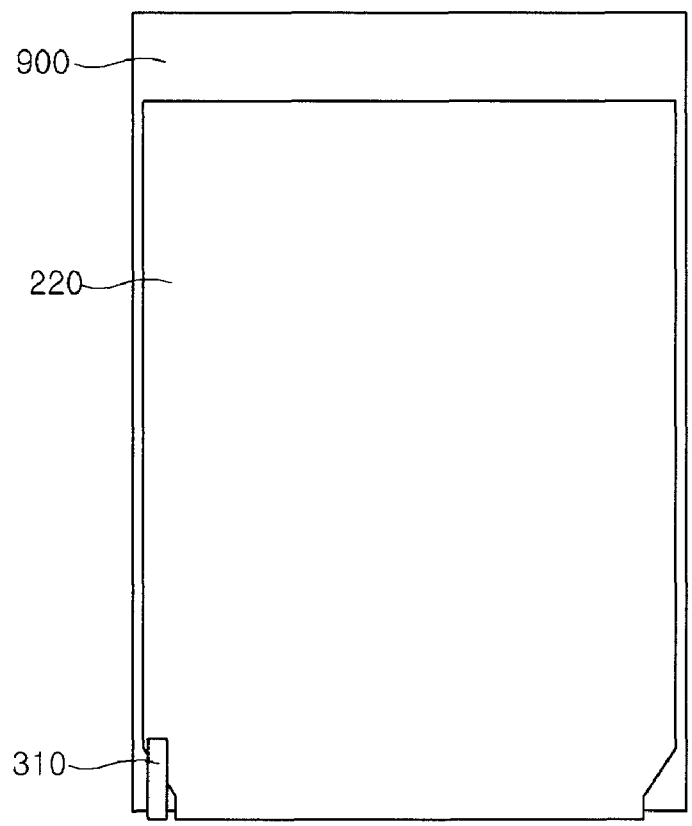
FIG. 2B is a rear view of the liquid crystal display illustrated in FIG. 1.
Figure 3:
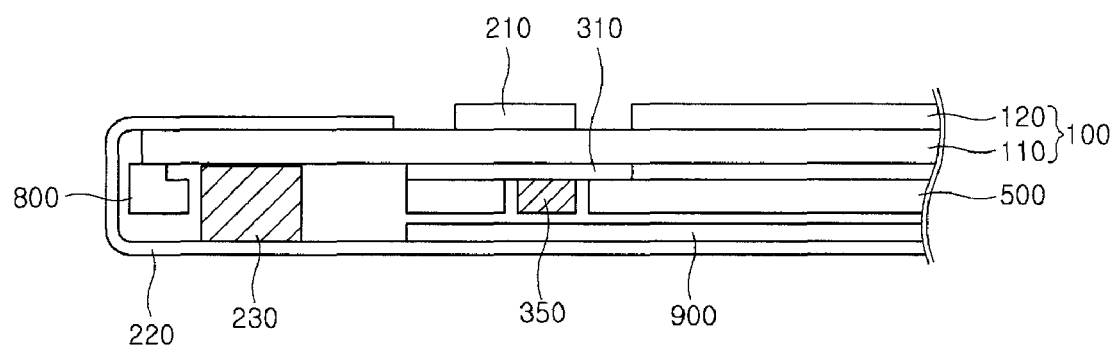
FIG. 3 is a schematic cross-sectional view of the liquid crystal display illustrated in FIG. 1.

FIG. 1 is an exploded perspective view of a liquid crystal display including a receiving member according to a first embodiment of the present invention, FIG. 2A a plan view of the liquid crystal display illustrated in FIG. 1, FIG. 2B a rear view of the liquid crystal display illustrated in FIG. 1, and FIG. 3 a schematic cross-sectional view of the liquid crystal display illustrated in FIG. 1, respectively.

With reference to FIGS. 1 to 3, the liquid crystal display includes a liquid crystal display panel 100, a driving circuit unit 200, a light source unit 300, a light guide plate 500, a plurality of optical sheets 700, a mold frame 800, and a chassis 900.

The liquid crystal display panel 100 includes a thin film transistor (TFT) substrate 110 and a color filter substrate 120.

The TFT substrate is a transparent glass substrate on which a matrix type TFT is formed. Data lines are connected to source terminals of the TFTs, and gate lines are connected to gate terminals. Furthermore, pixel electrodes that are formed of transparent electrodes made of a transparent conductive substance are formed on drain terminals. If an electric signal is applied to the data line and the gate line, each gated-on TFT applies the electric signal to a respective one of the pixels. When power is applied to the gate terminals and the source terminals of the TFT substrate to turn the TFTs on, an electric field is generated between the pixel electrode and the common electrode of the color filter substrate. The electric field alters the arrangement of the liquid crystal between the TFT substrate and the color filter substrate thereby changing the light transmission to display a desired image.

The color filter substrate is a substrate in which RGB color pixels, are formed using a thin film process. The common electrode that is made of a transparent conductive material such as indium tin oxide (ITO) or indium zinc oxide (IZO) is provided on the entire surface of the color filter substrate.

The driving circuit unit 200 includes a driving IC 210, a main flexible printed circuit board 220, and various circuit components 230 that are mounted on the main flexible printed circuit board 220. The driving IC 210 is mounted on the thin film transistor substrate 110, and the main flexible printed circuit board 220 is bonded to one side of the thin film transistor substrate 110 so that it can apply a predetermined gate signal to the gate lines of the TFT substrate and a predetermined data signal to the data lines.

The lamp unit 300 is used as a light source for the liquid crystal display panel 100 and, in this embodiment, includes a light emitting diode 350 and a LED flexible printed circuit board 310 on which the light emitting diode 350 is mounted. The LED flexible printed circuit board 310 is connected to the main flexible printed circuit board 220 of the driving circuit unit 200. In this embodiment, the light emitting diode is used as a light source, but other light sources may be used.

The light guide plate 500 converts light generated from the light emitting diode 350 into light that has an optical distribution in the form of a surface light source. A wedge type plate or a parallel flat type plate may be used as the light guide plate 500.

A plurality of optical sheets 700 is provided at the top of the mold frame 800 to ensure the uniformity of brightness distribution of light emitted from the light guide plate 500.

A reflection plate (not shown) may be provided at the bottom of the light guide plate. A plate having high light reflectivity is used as a reflection plate. A material with excellent reflection efficiency may be applied at the bottom of the chassis 900 to remove the reflection plate.

The mold frame 800 includes a plurality of sidewalls 810 and a part mounting unit 850 that is formed on any one wall of the plurality of the sidewalls 810. A predetermined receiving space is formed by a plurality of sidewalls 810 in the mold frame 800, and the part mounting unit 850 provides a space for the light source unit 300.

The part mounting unit 850 includes a mounting surface 820, a notch 830 which is formed on one side of the mounting surface 820, and at least one opening 840 which is formed in the mounting surface. The LED flexible printed circuit board 310 of the light source unit 300 is provided on the mounting surface 820, and the light emitting diode 350 is provided to fit into the notch 830. In addition, the main flexible printed circuit board 220 is bent and extended under the chassis 900, which allows a portion of various circuit components that are mounted on the main flexible printed circuit board 220 to be disposed in the opening 840. And as a result, the thickness of the liquid crystal display can be reduced. In this embodiment, the two openings 840 are formed on the mounting surface 820. However, the number of openings 840 is not limited thereto, and the number, shape, and size of the opening can be changed in variety.

The light guide plate 500 and a plurality of optical sheets 700 are disposed in the receiving space in the mold frame. Although not shown in the drawing, a hook (not shown) may be formed on the sidewall 810 of the mold frame 800 and is used as a means to hook the chassis 900.

The chassis 900 is provided under the mold frame 800, has a hexahedral structure with its top being removed, and is formed to expose one of the sidewalls of the mold frame 800, for example, a portion of the part mounting unit 850.

The chassis 900 includes a base plate 910, a plurality of sidewalls 920 that extend and bend from the base plate, and reinforcing tabs 930. The reinforcing tab 930 of the chassis 900 is formed to be in contact with the part mounting unit 850 in order to improve the strength of the part mounting unit 850 of the mold frame 800.

Moreover, in order to expose the openings 840 of the mold frame 800, the chassis 900 is formed so that a portion of the sidewalls 920 of the chassis and a portion of the base plate 910 corresponding to the openings 840 are removed. The reinforcing tabs 930 extend perpendicularly from the base plate 910, and come into contact with the openings 840. Although the strength of the mounting surface 820 may be reduced by forming the openings, it can be improved and the impact resistance of the mold frame 800 can be increased by constructing the reinforcing tabs 930 to be in contact with the openings 840, as described above.

A notch (not shown) to be linked to the hook may be formed in a corresponding region of the chassis 900 to the hook that is formed on the sidewall of the mold frame 800. Linking means of the mold frame and the chassis are not limited thereto, but can be changed in variety. The structure of the part mounting unit of the mold frame and the reinforcing tab of the chassis will be described in detail with reference to the following drawings.

Figure 4:
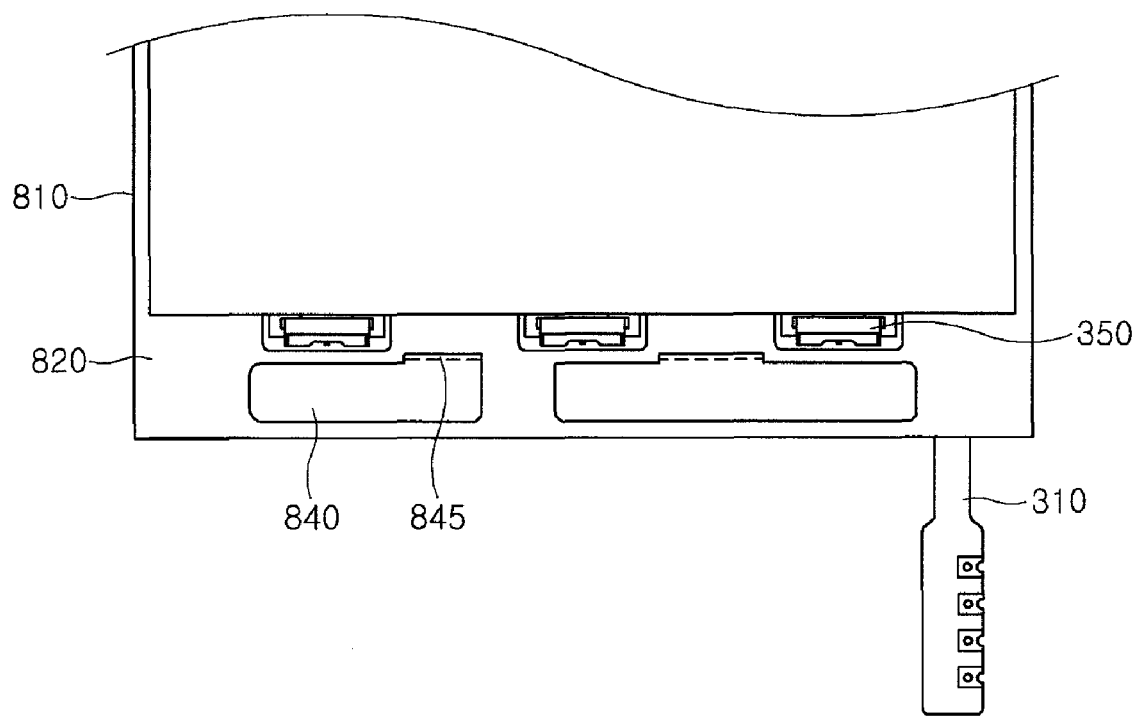
FIG. 4 is a plan view of a backlight unit including the receiving member according to the first embodiment of the present invention.
Figure 5A:
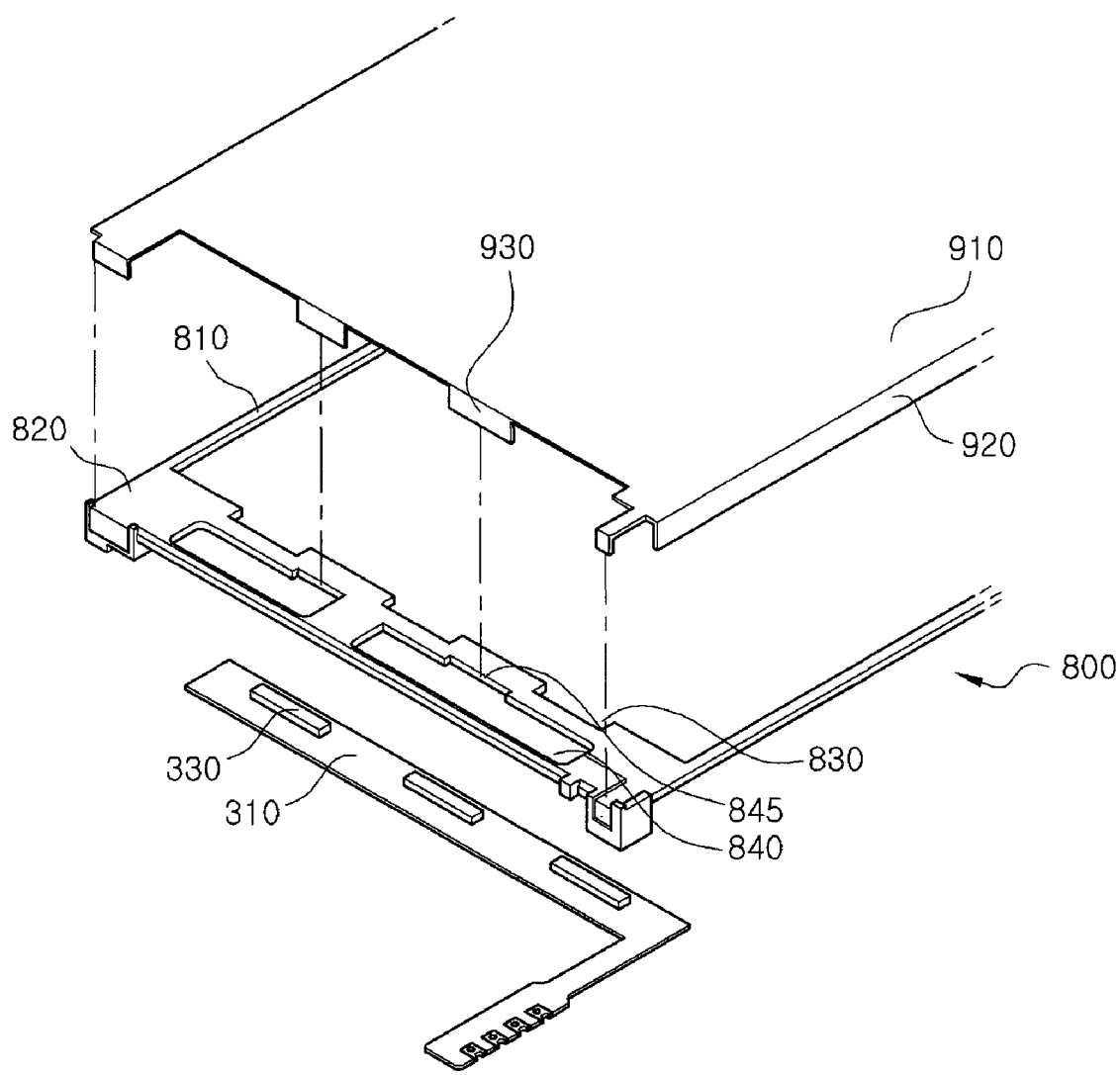
FIG. 5A is an exploded perspective view of a rear side of the backlight unit.
Figure 5B:
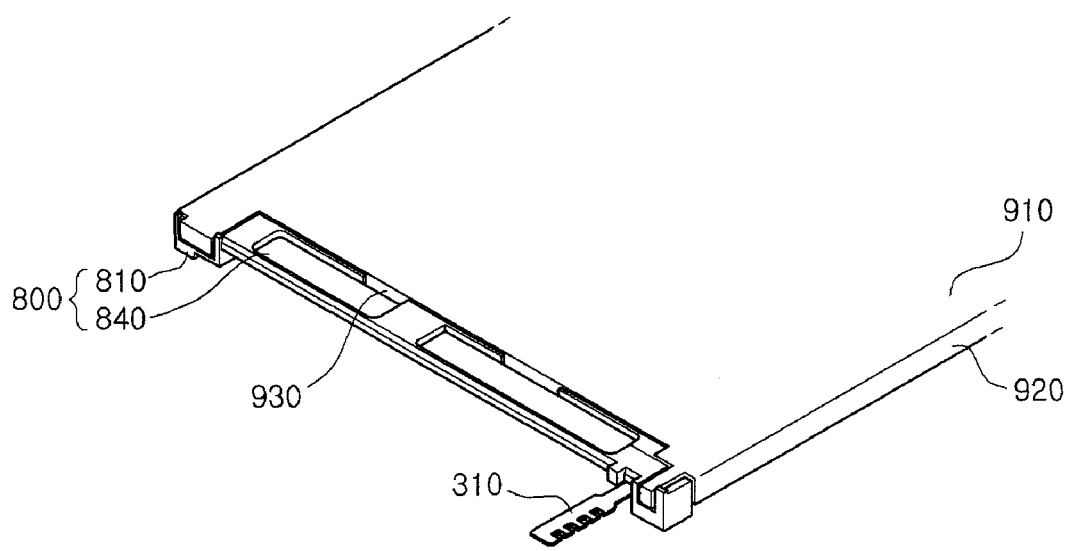
FIG. 5B is a perspective view of the rear side of the assembled backlight unit.

FIG. 4 is a plan view of a backlight unit including the receiving member according to the first embodiment of the present invention, FIG. 5A an exploded perspective view of a rear side of the backlight unit, and FIG. 5B a perspective view of the rear side of the assembled backlight unit.

With reference to FIGS. 4 to 5B, the receiving member according to the first embodiment of the present invention includes the mold frame 800 and the chassis 900 that is linked to the mold frame 800.

The mold frame 800 includes a plurality of sidewalls 810 and a part mounting unit 850 that includes a mounting surface 820, notches 830, openings 840, and linking recesses 845 for linking with reinforcing tabs 930 of chassis 900. The linking recesses 845 are formed in the openings 840 by extending therefrom to one side of the mounting surface, and are in contact with the reinforcing tabs 930 of the chassis. In this embodiment, the linking recesses 845 are formed in regions not facing the notches 830. In other words, the linking recesses 845 and the notches 830 are formed not to face each other.

The chassis 900 includes the base plate 910, a plurality of sidewalls 920, and the reinforcing tabs 930. In order to expose the openings 840 of the mold frame 800, a portion of the sidewalls 920 of the chassis and a portion of the base plate 910 corresponding to the openings 840 are removed. The reinforcing tabs 930 is extended and bent from one side of the base plate, that is, the side in which the sidewalls are not formed, and then linked with linking recesses 845. Further, the reinforcing tabs 930 are formed to have a corresponding size and position to the linking recesses 845. Furthermore, reinforcing tabs 930 may be formed by bending a portion of the base plate 910 of the chassis 900.

Because, regions around the openings of the mold frame may bend easily compared to the other regions when an impact is applied, it is more probable that interaction between components may take place causing errors. However, if the reinforcing tabs of the chassis fix the regions around the openings, it is possible to prevent damage of the parts due to the interaction or collision between the mold frame and the circuit components.

Figure 6:
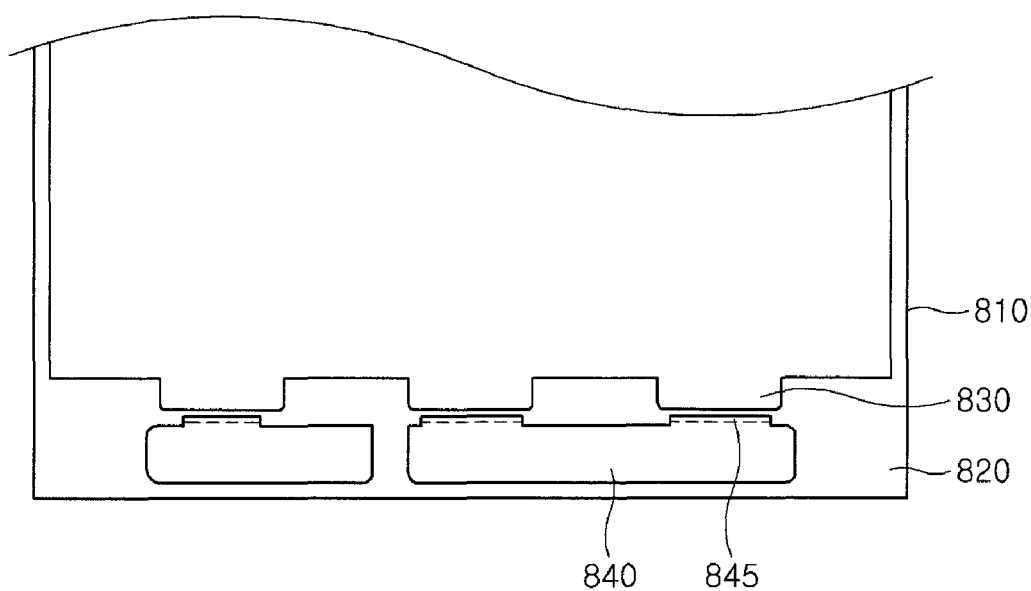
FIG. 6 is a plan view of a mold frame of a receiving member according to a second embodiment of the present invention.
Figure 7A:
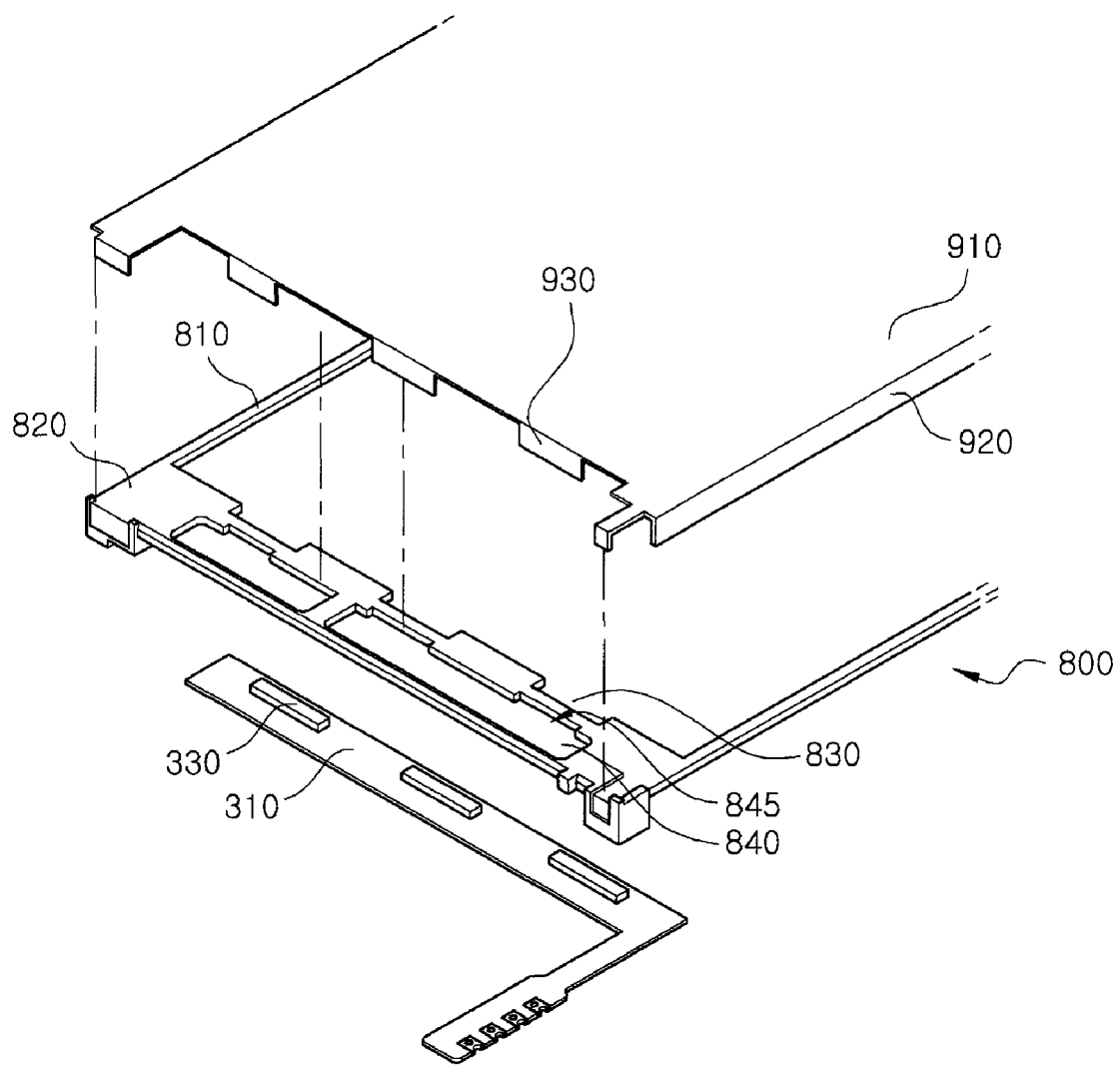
FIG. 7A is an exploded perspective view of a rear side of a backlight unit including the receiving member according to the second embodiment of the present invention.
Figure 7B:
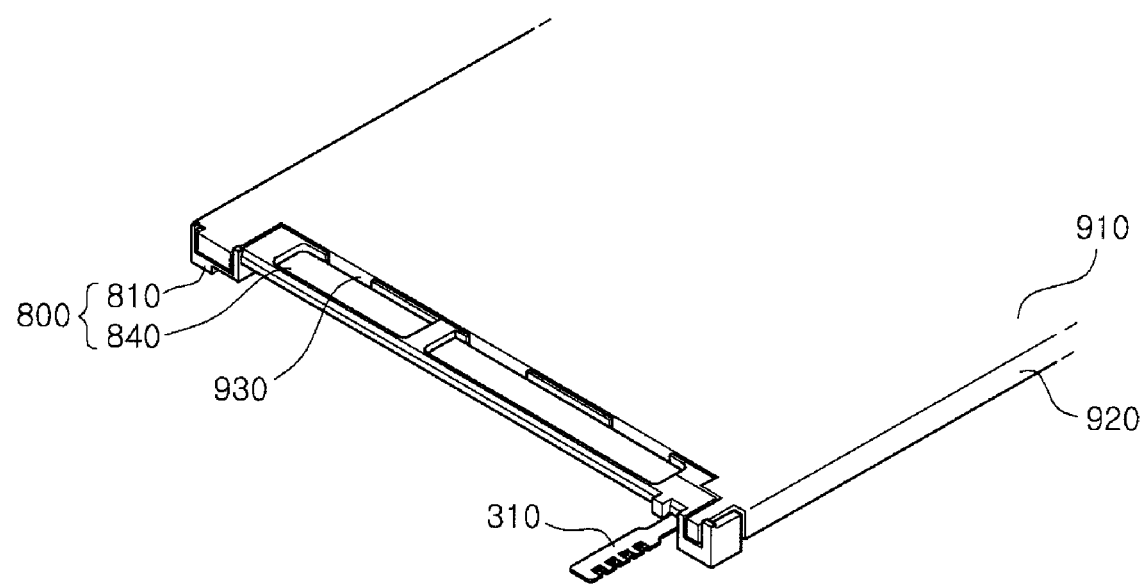
FIG. 7B is a perspective view of the rear side of the assembled backlight unit.

FIG. 6 is a plan view of a mold frame of a receiving member according to a second embodiment of the present invention, FIG. 7A an exploded perspective view of a rear side of a backlight unit including the receiving member according to the second embodiment of the present invention, and FIG. 7B a perspective view of the rear side of the assembled backlight unit. The parts and components of the second embodiment of the present invention which is shown in FIGS. 6 to 7B are almost the same as those of the first embodiment, except the positions of the linking recesses 845 and the reinforcing tabs. Therefore, a description will be focused on the difference between the two embodiments hereinafter.

The receiving member according to the second embodiment of the present invention includes a mold frame 800 and a chassis 900 that is linked to the mold frame 800.

The mold frame 800 includes a plurality of sidewalls 810 and a part mounting unit 850, and the part mounting unit 850 includes a mounting surface 820, notches 830, openings 840, and linking recesses 845. Further, the linking recesses 845 are formed in regions facing the notches 830. In other words, the linking recesses 845 are formed to face the notches 830. The chassis 900 includes the base plate 910, a plurality of sidewalls 920, and the reinforcing tabs 930. The reinforcing tabs 930 are extended and bent from one side of the base plate, and linked with the linking recesses 845. The reinforcing tabs 930 herein have a corresponding size and position to the linking recesses 845. In addition, the reinforcing tabs 930 can be formed by bending a portion of the base plate 910 of the chassis.

When it is difficult to ensure a margin for a sufficient spacing between the linking recesses 845 and the notches 830, the linking recesses are formed in regions not facing the notches 830 as in the first embodiment. In the other hand, when it is possible to ensure a margin for a sufficient spacing between the linking recesses 845 and the notches 830, the linking recesses are formed in regions facing the notches as in the second embodiment.

Although a receiving member, and a backlight unit and a liquid crystal display including the receiving member according to the present invention have been described with reference to the accompanying drawings and the preferred embodiments, the present invention is not limited thereto, but is defined by the appended claims. Therefore, it should be noted that various changes and modifications can be made by those skilled in the art without departing from the technical spirit of the appended claims.

As described above in the present invention, impact resistance of a vulnerable region caused by formation of part mounting unit can be improved by reinforcing the region using a reinforcing tab of a chassis. Therefore, it is possible to prevent damage of the liquid crystal display panel, the mold frame, or the circuit parts when an impact is applied. Thereby, the reliability of products is improved and the slimness and the compactness of the liquid crystal display are ensured.

What is claimed is:

1. A receiving member comprising:
   a mold frame having a part mounting unit including a receiving space; and
   a chassis linked to the mold frame including a reinforcing tab in reinforcing contact with the part mounting unit, wherein the part mounting unit comprises a mounting surface and at least one opening formed within the mounting surface,
   wherein the mold frame comprises a plurality of sidewalls, the part mounting unit being formed on any one wall of the plurality of sidewalls, the chassis including a base plate and a plurality of walls extending from the base plate,
   wherein the part mounting unit comprises a notch formed at one side of the mounting surface,
   wherein a portion of the sidewalls of the chassis and a portion of the base plate corresponding to the opening within the mounting surface of the mold frame are removed to expose the opening of the mold frame, and wherein the reinforcing tab extended and bent from the base plate, and formed to be in contact with the opening of the mold frame.

2. The receiving member of claim 1, wherein the part mounting unit further comprises a linking part formed in the opening, and the reinforcing tab is linked into the linking part.

3. The receiving member of claim 2, wherein the reinforcing tab has the corresponding size and position to the linking part.

4. The receiving member of claim 2, wherein the linking part is formed in a region other than a region facing a notch.

5. A backlight unit comprising:
a light source unit; and
a receiving member comprising:
a mold frame having a part mounting unit on which the light source unit is mounted, the mold frame having a receiving space; and
a chassis including a reinforcing tab linked to the mold frame and being in contact with the part mounting unit to reinforce the strength of the part mounting unit,
wherein the mold frame comprises a plurality of sidewalls, the part mounting unit being formed on any one wall of the plurality of sidewalls, the chassis having a base plate and a plurality of sidewalls extended and bent from the base plate, and the part mounting unit having a mounting surface, a notch formed at one side of the mounting surface, and an opening that is formed inside the mounting surface, and
wherein the reinforcing tab extended and bent from the base plate, and formed to be in contact with the at least one opening of the mold frame.

6. The backlight unit of claim 5, wherein the light source unit comprises:
a light emitting diode; and
a first circuit substrate having the light emitting diode mounted thereon.

7. The backlight unit of claim 6, wherein the light emitting diode is disposed in the notch of the part mounting unit.

8. The backlight unit of claim 6, wherein a portion of the sidewalls of the chassis and a portion of the base plate corresponding to the opening are removed to expose the opening of the mold frame.

9. The backlight unit of claim 8, wherein the part mounting unit further comprises a linking part formed in the opening, the reinforcing tab being linked into the linking part.

10. A liquid crystal display comprising:
a backlight unit comprising:
a light source unit that comprises a light emitting diode and a first circuit substrate whereon the light emitting diode is mounted; and
a receiving member that comprises a mold frame having a part mounting unit on which the light source unit is mounted and a receiving space, and a chassis that is linked to the mold frame and comprises a reinforcing tab in contact with the part mounting unit to reinforce strength of the part mounting unit; and
a liquid crystal display panel that is disposed on the backlight unit to display an image,
wherein the mold frame comprises a plurality of sidewalls having the part mounting unit formed on any one wall of the plurality of sidewalls, and the chassis having a base plate and a plurality of walls extended and bent from the base plate, the part mounting unit comprises a mounting surface, a notch formed at one side of the mounting surface, and at least one opening formed inside the mounting surface, and
wherein the reinforcing tab is extended and bent from the base plate, and formed to be in contact with the opening.

11. The liquid crystal display of claim 10, further comprising:
a driving circuit unit comprising:
a second circuit substrate that is bonded to one side of the liquid crystal display panel in order to drive the liquid crystal display panel; and
circuit components that are mounted on the second circuit substrate.

12. The liquid crystal display of claim 11, wherein the light emitting diode is disposed in the notch of the part mounting unit, and at least a portion of the circuit components of the driving circuit unit is disposed in the opening of the part mounting unit.

* * * * *